(12) United States Patent
Tower et al.

(10) Patent No.: US 11,248,723 B2
(45) Date of Patent: Feb. 15, 2022

(54) CABLE MANAGEMENT ARM BASKET CLIP

(71) Applicant: Hewlett Packard Enterprise Development LP, Houston, TX (US)

(72) Inventors: Daniel W. Tower, Houston, TX (US); Kevin Bold, Houston, TX (US); Kevin Conn, Houston, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 19 days.

(21) Appl. No.: 16/654,420

(22) Filed: Oct. 16, 2019

(65) Prior Publication Data

US 2021/0116052 A1 Apr. 22, 2021

(51) Int. Cl.
*F16L 3/12* (2006.01)
*H05K 7/14* (2006.01)

(52) U.S. Cl.
CPC .......... *F16L 3/1226* (2013.01); *H05K 7/1491* (2013.01)

(58) Field of Classification Search
CPC ....... F16L 3/1226; F16L 3/085; F16L 3/1075; F16L 3/1083; F16L 3/1091; F16L 3/10; H05K 7/1491; H05K 7/1488; H05K 7/183
See application file for complete search history.

(56) References Cited

U.S. PATENT DOCUMENTS

| | | | | |
|---|---|---|---|---|
| 2,855,648 A | * | 10/1958 | Jansson | F16L 3/227 403/219 |
| 4,221,352 A | * | 9/1980 | Caveney | H02G 3/32 248/74.3 |
| 5,161,759 A | * | 11/1992 | Burns | B60R 16/0215 248/71 |
| 6,572,057 B1 | * | 6/2003 | Roth | F16L 3/243 248/58 |
| 6,646,893 B1 | | 11/2003 | Hardt et al. | |
| 7,017,866 B2 | * | 3/2006 | Whorton | F16L 3/11 248/71 |
| 7,326,855 B2 | * | 2/2008 | Moffatt | F16L 3/22 174/138 G |
| 7,355,120 B2 | | 4/2008 | Herring et al. | |
| 8,215,595 B2 | | 7/2012 | Li | |
| 8,598,462 B2 | | 12/2013 | Li | |
| 9,212,765 B1 | * | 12/2015 | Chia | H04Q 1/06 |
| 9,402,329 B1 | | 7/2016 | Chen et al. | |
| 2006/0065424 A1 | | 3/2006 | Mead et al. | |
| 2018/0049341 A1 | * | 2/2018 | Chen | H05K 7/1491 |

FOREIGN PATENT DOCUMENTS

EP 3361846 A1 8/2018

OTHER PUBLICATIONS

Hellermanntyton, "P-clamps for mounting cables and hoses," Jun. 16, 2019, 9 Pgs., https://www.hellermanntyton.com/sg/competences/p-damp.

* cited by examiner

*Primary Examiner* — Christopher Garft
(74) *Attorney, Agent, or Firm* — Hewlett Packard Enterprise Patent Department

(57) ABSTRACT

A cable management arm basket clip, comprising: a latch to secure the cable management arm basket clip to a cable management arm basket; a connection to pivotally connect the cable management arm basket clip to the cable management arm basket; and guards disposed on both sides of the cable management arm basket clip to allow for passage of cables and to protect cables.

12 Claims, 8 Drawing Sheets

CABLE MANAGEMENT ARM BASKET CLIP

BACKGROUND

Cable management arm designs do not include a support. In other words, when a computing device is extended or pulled from a rack, the cable management arm is not physically supported, other than at the point where the cable management arm attaches to a rail kit. Some computing device designs may utilize longer and heavier cables, in part due to the extra length of the computing device design and the extra distance that the computing device may be extended from a rack. The additional weight and length of the cables is too much for a cable management arm without additional support.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

Figure 1A:
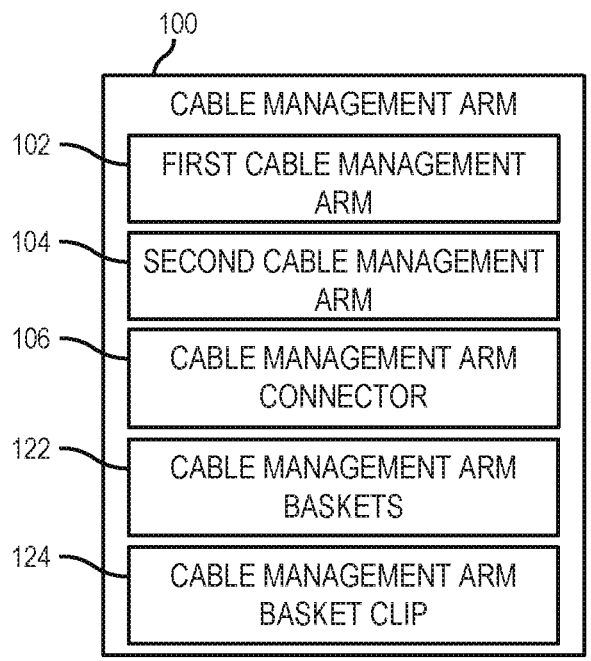
FIG. 1A is a block diagram of a cable management arm, according to an example.

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Computing devices, particularly servers, may be added to or installed in a rack. A rack may be a structure for housing multiple computing devices. Generally, a rack may consist of four posts or columns with mounting holes or apertures to facilitate the addition or mounting of computing devices. A rail kit may attach to a computing device and to a rack, thus allowing a computing device to be mounted to the rack. Further, the rail kit may allow the computing device to be slid in and out of the rack while remaining mounted to the rack, thus providing access to a user for a portion of the computing device. The rail kit may be formed to support a certain weight, based on past models of computing devices. A cable management arm may refer to a support structure located at the rear of a computing device. In an example, the cable management arm may attach to one of two rail kits attached to the computing device. The cable management arm may support the cables connected to a computing device as a computing device is pulled forward, pushed inward, in an extended position, and in a retracted position.

Cable management arm designs do not include a support. In other words, when a computing device is extended or pulled from a rack, the cable management arm is not physically supported, other than at the point where the cable management arm attaches to a rail kit. Some computing device designs may utilize longer and heavier cables, in part due to the extra length of the computing device design and the extra distance that the computing device may be extended from a rack. The additional weight and length of the cables is too much for a cable management arm without additional support.

Based on the issues described above, a support may be added underneath the cable management arm to add support. In an example, the support may be a rail kit or some other similar friction slide component, ball bearing component, other type of slide components, or some combination thereof. In an example, a rail kit (e.g., a friction slide support) for the cable management arm may be attached (for example, pivotally connected) to one side of a cable management arm retainer. The cable management arm retainer may be connected to the rail kit of the computing device (for example, the opposite rail kit of the computing device which the cable management arm may attach to). The rail kit for the cable management arm may connect to the cable management arm via a pin connected through a connector of the cable management arm to a slide of the rail kit for the cable management arm. In another example, the support for the cable management arm may connect to the same rail kit of the computing device as the cable management arm attaches to.

In such designs, cables may be more exposed than in prior designs, particularly around the cable management arm connector. To prevent cable damage and/or for other reasons, the cable management arm may utilize cable management arm baskets and cable management arm basket clips. The cable management arm basket may be positioned at various points along the cable management arm and cable management arm connector.

Examples described herein, include a cable management arm comprising a first cable management arm to connect to a first connector of a first rail kit of a computing device and a second cable management arm to connect to a second connector of the first rail kit of the computing device. The cable management arm may also comprise a cable management arm connector to pivotally attach to the first cable management arm and the second cable management arm. Cable management arm baskets may connect to the first cable management arm, the second cable management arm, and/or the cable management arm connector. Each cable management arm basket may include a cable management arm basket clip. In an example, the cable management arm basket clip connected to the cable management arm basket on the cable management arm connector may include a latch to secure the cable management arm basket clip to a cable management arm basket. In such examples, the cable management arm basket clip may include a connection to pivotally connect the cable management arm basket clip to the cable management arm basket. Further, the cable management arm basket clip may include guards disposed or integrally formed on both sides of the cable management arm basket clip to allow for passage of and to protect cables.

FIG. 1A is a block diagram of a cable management arm 100. The cable management arm 100 may comprise a first cable management arm 102 to connect to a first connector of a first rail kit of a computing device and a second cable management arm 104 to connect to a second connector of the first rail kit of the computing device. The cable management arm 100 may also comprise a cable management arm connector 106 to pivotally attach to the first cable management arm 102 and the second cable management arm 104. The cable management arm 100 may also include cable management arm baskets 122. For example, the first cable management arm 102, the second cable management arm 104, and/or the cable management arm connector 106 may include at least one cable management arm basket 122. The cable management arm 100 may include a cable management arm basket clip 124 to connect to the cable management arm baskets 122, for example the cable management arm basket clip 124 to connect to a cable management arm basket connected to the cable management arm connector 106.

As used herein, a "computing device" may be a storage array, storage device, storage enclosure, server, blade server, desktop or laptop computer, computer cluster, node, partition, or any other device or equipment including a controller, a processing resource, or the like. In examples described herein, a "processing resource" may include, for example, one processor or multiple processors included in a single computing device or distributed across multiple computing devices. As used herein, a "processor" may be at least one of a central processing unit (CPU), a semiconductor-based microprocessor, a graphics processing unit (GPU), a field-programmable gate array (FPGA) to retrieve and execute instructions, other electronic circuitry suitable for the retrieval and execution instructions stored on a machine-readable storage medium, or a combination thereof.

As used herein, "rack unit" or "U" may refer to the unit of measurement to define the height of a rack frame and the height of the equipment in a rack frame (such as, computing devices). Each rack unit may be equivalent to 44.50 millimeters or 1.75 inches. For example, a computing device, such as a rack server, may have a height of 2 U or 2 rack units (in other words, 89 millimeters or 3.5 inches).

As used herein, "forward" refers to an orientation that is aligned with a horizontal vector pointing from a rear of the bracket assembly toward a front of the bracket assembly, while "rearward" refers to an orientation that is aligned with a horizontal vector pointing from a front of the bracket assembly toward a rear of the bracket assembly. In FIGS. 2-8, "forward" is aligned with the +$\hat{y}$ direction, while "rearward" is aligned with the −$\hat{y}$ direction. When one of the example rail kits is installed in a device rack, the "forward" orientation may be aligned with a vector extending from a rear column of the device rack to a front column of the device rack, and vice-versa for the "rearward" orientation. Forward movement or extension is movement or extension in a forward oriented direction, whereas rearward movement or extension is movement or extension in a rearward oriented direction.

As used herein, "inward" refers to an orientation that is aligned with a vector that would point from the rail kit toward the electronic device if the electronic device were mounted to the rail kit. As used herein and in the appended claims, "outward" refers to an orientation that is the opposite of the "inward" orientation (i.e., an orientation that is aligned with a vector that would point away from the electronic device if the electronic device were mounted to the rail kit). "Inward" and "outward" for one rail kit will not necessarily be identical to "inward" and "outward" for another rail kit, since the different rail kits may be oriented differently from one another. For example, when a pair of rail kits is installed in a device rack, they may be facing each other, and thus "inward" for one of the rail kits may be pointing in an opposite direction as "inward" for the other one of the rail kits. For example, in FIGS. 2-8, "inward" is aligned with the +$\hat{x}$ direction for the left-side rail kit 10L, and with the −$\hat{x}$ ion for the right-side rail kit 10R. Similarly, "outward" is aligned with the −$\hat{x}$ direction for the left-side rail kit 10L and the +$\hat{x}$ direction for the right-side rail kit 10R. Inward movement or extension is movement or extension in an inward oriented direction, whereas outward movement or extension is movement or extension in an outward oriented direction.

As used herein, a first element may be to "couple" with a second element if the first element is capable of extending into an opening defined by the second element.

As used herein, a first element is "connectable" to a second element if the first element is so configured that it is capable of being connected to the second element; however, this does not require that the first element actually be connected to the second element. For example, in the example rail kit the inner slide may not be connected to any electronic device initially, but the inner slide is nonetheless still "connectable" to an electronic device even in this state because the inner slide is so configured that it could be connected to an electronic device.

As used herein, a first element may be considered to "prevent movement" of a second element in some specified direction if the first element constrains the second element such that it cannot move in the specified direction beyond some point; however, this does not imply that the first element necessarily has to keep the second element from any and all movement in the specified direction. In other words, when it is said that some element "locks" another element, this does not mean that it completely prevents all movement of the element, but rather that it sets some constraint on movement. For example, when it is said that the first latch prevents the inner slide and middle slide from moving in both the forward direction and the rearward direction when it is in the locked position, this means that the first latch constrains the movement of the inner slide in the forward and rearward directions to be within some finite range of positions; however, the first latch does not necessarily prevent the inner slide and outer slide from all forward and rearward motion and the inner slide and middle slide may move forward and rearward freely within the finite range. This reflects the fact that some finite tolerance or "wiggle room" may be inevitable due to manufacturing variances. In addition, in certain examples some finite tolerance or "wiggle room" may be intentionally included in the design to facilitate smooth functioning of the locking mechanism.

As used herein, a first element is "engagable" by a second element if the first element is so configured that it is capable of being engaged by the second element; however, this does not require that the first element actually be engaged by the second element. For example, in the example rail kit the inner slide may not be engaged by the middle slide initially, but the inner slide is nonetheless still "engagable" by the middle slide even in this state because the inner slide is so configured that it could be engaged by the middle slide.

FIG. 1A, as noted above, is a block diagram of a cable management arm 100. In another example, the first cable management arm 102, the second cable management arm 104, and the cable management arm connector 106 may include one or more cable loops or cable management arm baskets 122. In another example, the first cable management arm 102, second cable management arm 104, and cable management arm connector 106 may include apertures or mounts to allow for mounting of cable loops or cable management arm baskets 122. In another example, the first cable management arm 102 and the second cable management arm 104 may comprise a flat or substantially flat component with a curve at the end connecting to the cable management arm connector 106. In another example, the first cable management arm 102 and the second cable management arm 104 may be comprised of plastic, metal, or any other material suitable for computing device cable retention. In another example, the first cable management arm 102 and the second cable management arm 104 may be almost as long as the width of the computing device that the cable management arm 100 is attached to.

In another example, the first cable management arm 102 and/or second cable management arm 104 may comprise two separate sections. In such examples, the two sections may meet, engage, or connect at around the midpoint of a cable management arm extension. In a further example, the back side of the first cable management arm 102 and second cable management arm 104 (in other words, the side opposite where the cable management arm extension is located) may include a channel in one section and a rail attached to the other section. The rail may insert into the channel, when the two sections are adjacent or engaged. Upon extension of the cable management arm 100, the rail may extend out of the channel. In another example, a spring may connect the rail to the other section (in other words the section with the channel) of the first cable management arm 102 and second cable management arm 104. In such examples, upon retraction of the cable management arm 100, the spring may force the rail to snap back into the channel. In other words, the spring may provide an amount of tension to assist the cable management arm extension in returning back to shape.

As noted above, the first cable management arm 102 and/or the second cable management arm 104 may include a cable management arm extension. The cable management arm extension may be U-shaped. In another example, the cable management arm extension may be composed of a flexible material. In such examples, the cable management arm extension may be one piece. For example, as the cable management arm 100 extends and the first cable management arm 102 and the second cable management arm 104 are pulled out and apart, the sections of the first cable management arm 102 and the second cable management arm 104 may separate. During such an occurrence, the cable management arm extension (whether on the first cable management arm 102 or the second cable management arm 104) may flatten, thus allowing the cable management arm 100 to travel further. In another example, the cable management arm extension may be comprised of hinged sections and plates. In such examples, the cable management arm extension may include two hinged sections each connected to a section of the first cable management arm 102 or the second cable management arm 104. The hinged sections may also connect to a plate section. The plate section may include a cable loop, apertures to allow for installation of a cable loop, or other mounting components to allow for installation of a cable loop. In an example, the cable management arm extension may allow for the cable management arm 100 to extend further than normal. For example, a computing device may include an enclosure extension, thus lengthening the computing device. To access components within the computing device, a user may extend or pull the computing device further than normal. The cable management arm 100, with at least one cable management arm extension (included in either the first cable management arm 102 or second cable management arm 104), may support such a computing device and the extra distance the computing device may extend.

In another example, the cable management arm connector 106 may be a C or U shaped component. In another example, the cable management arm connector 106 may pivotally connect to the first cable management arm 102 and the second cable management arm 104 via hinge, latch, pin, some other means for physically or mechanically coupling or fastening physical components, or some combination thereof. The connection between the first cable management arm 102 and the cable management arm connector 106 may allow the first cable management arm 102 to move outward from the connection. Additionally, the connection between the second cable management arm 104 and the cable management arm connector 106 may allow the second cable management arm 104 to move outward from the connection. In another example, the cable management arm connector 106 may include a stop or protrusion to prevent the first cable management arm 102 and/or second cable management arm 104 from moving inwards, in relation to the connection between the cable management arm connector 106 and the first cable management arm 102 and/or second cable management arm 104.

In another example, the cable management arm connector 106 may include a flat triangular or wedge shaped section. The section may be formed on or integral to the cable management arm connector 106. The section of the connector may include an aperture. A portion of the rail kit 108 corresponding to the aperture of the section may include an aperture. In a further example, the outer slide 114 may include the aperture, while the inner slide 112 may not. In other words, the cable management arm connector 106 may be pinned to the outer slide 114, but not the inner slide 112. In another example, the rail kit 108 may include a short slide 202. The short slide 202 may slidably connect to the outer slide 114. In such examples, the cable management arm connector 106 may pin or fasten to the short slide 202, rather than to the outer slide 114. In such examples, the outer slide 114 may not include an aperture. A pin or fastener may be inserted into the corresponding apertures and secured. In a further example, the pin or fastener may allow the cable management arm connector 106 to pivot about the rail kit 108. Thus, as the cable management arm 100 extends the cable management arm connector 106 may pivot about the rail kit 108, allowing the cable management arm 100 to move forward and towards the first rail kit of the computing device.

As noted above, the cable management arm connector 106 may not connect directly to the outer slide 114. In such examples, the cable management arm connector 106 may connect to a short slide 202. In such examples, the short slide 202 may slidably connect to the outer slide 114. In such examples, the short slide 202 may slide along the outer slide 114. In a retracted position the short slide 202 and cable management arm connector 106 may be located close to one side of the rack or, in other words, near the second rail kit of the computing device. As the computing device extends or pulls forward (in other words, pulls out from a rack), the short slide 202 and cable management arm connector 106 may travel up the outer slide 114. In a fully extended position, the short slide 202 and cable management arm connector 106 may be located near the first rail kit of the computing device. In such examples, the outer slide 114 may include a stop at one or both ends, to prevent movement or prevent the short slide 202 from extending past the past the ends of the outer slide 114.

As noted above, additional support may be utilized for additional cabling (as in, the additional weight, amount, and/or length of cables). In addition, the cable management arm 100 may support a 1U computing device, a 2U computing device, a 4U computing device, or larger/smaller computing devices. In a further example, the 1U computing device (or any other size computing device) may be longer than a typical 1U computing device. In such examples, longer cabling may be utilized to allow for the computing device to be pulled further out of a rack, thus allowing a user access to all components internal to the computing device. The rail kit 108 for the cable management arm 100 may add additional support and stability to the cable management arm 100. The rail kit 108 may follow the cable management arm 100 as the cable management arm 100 extends. In such examples, the rail kit 108 may attach to the cable management arm connector 106. As the cable management arm 100 extends, the cable management arm connector 106 and rail kit 108 may move forward or outward and towards the first rail kit of the computing device. Thus the rail kit 108 may support the first cable management arm 102, the second cable management arm 104, and the cable management arm connector 106.

Figure 1B:
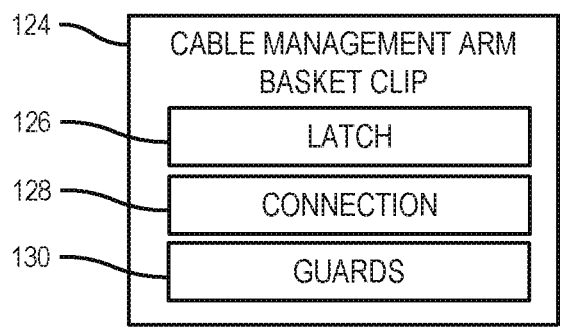
FIG. 1B is a block diagram of a cable management arm basket clip, according to an example.

FIG. 1B is a block diagram of a cable management arm basket clip 124, according to an example. In such examples, the cable management arm basket clip 124 may connect to a cable management arm basket 122. In such examples, the cable management arm basket clip 124 may attach to the cable management arm basket 122 via connection 128. In such examples, the connection 128 may connect to a pin, rod, protrusion, or some other means for connection included on the cable management arm basket 122. In such examples, the connection 128 may include a pair of clips to removably attach to, for example, either side of a pin. In another example, the connection 128 may toollessly attach to the cable management arm basket 122. Further, the connection 128, while retaining attachment of the cable management arm basket clip 124 to the cable management arm basket 122, may also allow for movement of the cable management arm basket clip 124. For example, a user may flip or move the cable management arm basket clip 124 to an up or open position from a down or closed position, or to a down or closed position from an open or up position. In other words, the connection 128 may allow the cable management arm basket clip to pivot about the attachment point between the cable management arm basket 122 and the cable management arm basket clip 124. As noted the, connection 128 may removable attach to the cable management arm basket 122.

In another example, the cable management arm basket clip 124 may include a latch 126. In such examples, the latch 126 may latch or lock onto an end of the cable management arm basket 122. In an example, the latch 126 may be a hook to lock onto a protrusion of the cable management arm basket 122. In such examples, to lock onto the cable management arm basket 122, a user may push the latch 126 past the protrusion, until the latch 126 locks into place. Further, the latch 126 may be comprised of a resilient and/or flexible material, thus allowing the latch to push past the protrusion and lock into place or unlock.

In another example, the cable management arm basket clip 124 may include guards 130. In an example, the cable management arm basket clip 124 may include two guards 130. In such examples, one of each guard 130 may extend from one side of the cable management arm basket clip 124. In another example, the guards 130 may be perpendicular to the latch 126 and connection 128. In another example, the guards 130 may extend out in an angular direction.

Figure 2:
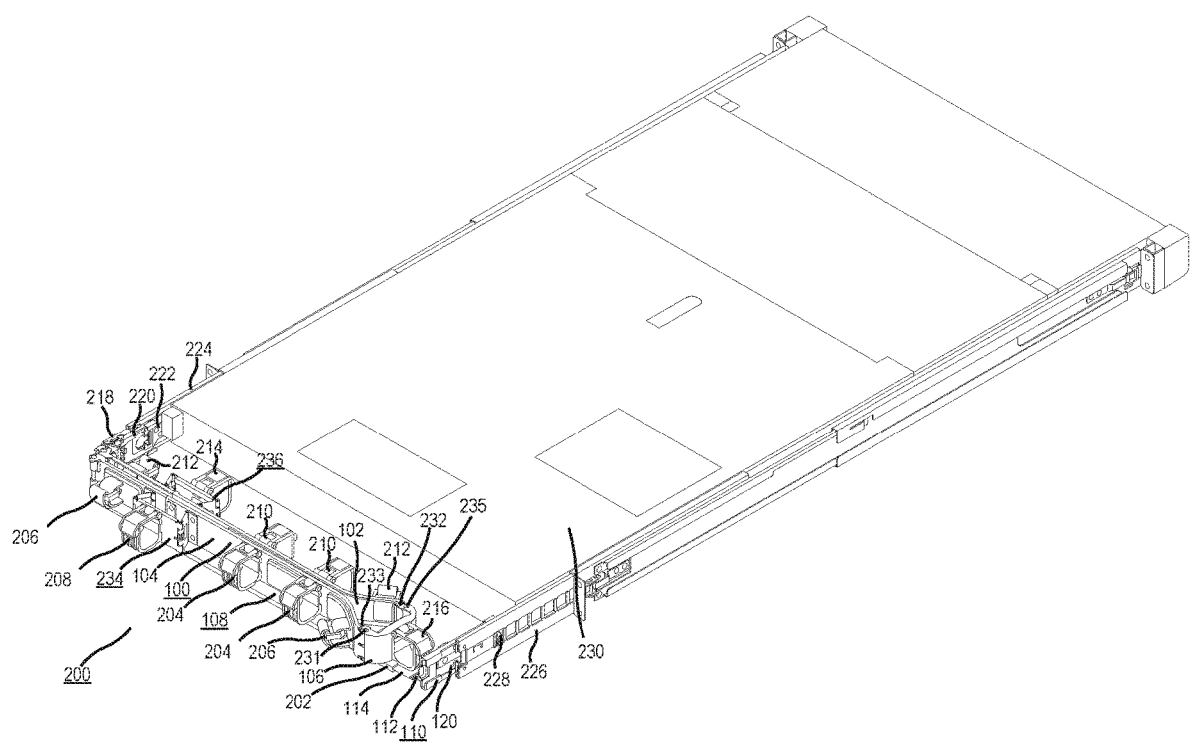
FIG. 2 is a schematic view of a cable management arm attached to a computing device, according to an example.

FIG. 2 is a schematic view of a cable management arm 100 attached to a computing device 230. In such examples, the cable management arm 100 may attach at the rear or back of the computing device 230. In an example, the cable management arm 100 may include a first cable management arm 102 and a second cable management arm 104. The first cable management arm 102 may pivotally connect to one end of cable management arm connector 106, via pin 235, while the second cable management arm 104 may pivotally connect, via pin 231, to the other end of the cable management arm connector 106. In such examples, the cable management arm connector 106 may include stops or protrusions 232, 233 to prevent the first cable management arm 102 and the second cable management arm 104 from moving towards each other or inwards. For example, if a user attempts to push the first cable management arm 102 towards the second cable management arm 104, protrusion 232 may prevent the first cable management arm 102 from moving further than shown in FIG. 2 towards the second cable management arm 104.

In such examples, the other end of the first cable management arm 102 may include a latch 220 to connect to or engage with a first connector 222 of a first rail kit 224 of the computing device 230. Further, the other end of the second cable management arm 104 may include a latch 218 to connect to or engage with a second connector (not visible) of the first rail kit of the computing device 230. In such examples, the second connector of the first rail kit of the computing device 230 may remain stationary (as in, not move as the computing device 230 is extended/retracted). In another example, the first cable management arm 102 and the second cable management arm 104 may attach or connect to the second rail kit 226 of the computing device 230.

In another example, the cable management arm connector 106 may connect to a rail kit 108. The rail kit 108 may include an inner slide 112, an outer slide 114, and a short slide 202. The cable management arm connector 106 may connect to the outer slide 114 or, if present, the short slide 202. The short slide 202 may slidably connect to the outer slide 114. The inner slide 112 may slidably connect to the outer slide 114. In other words, the inner slide 112 may fit or insert into a channel of the outer slide 114. In another example, the inner slide 112 may pivotally connect to the attachment bracket 118 of the cable management arm retainer 110. In such examples, the rail kit connector 120 of the cable management arm retainer 110 may connect to or engage with the connector 228 of the second rail kit of the computing device 230. In such examples, connector 228 of the second rail kit of the computing device 230 may remain stationary (as in, not move) as the computing device 230 is extended/retracted. In such examples, the inner slide 112 of the rail kit 108 may pivotally attach to the connector 228 of the second rail kit 226. In another example, when the first cable management arm 102 and the second cable management arm 104 attaches or connects to the second rail kit 226 of the computing device 230, the cable management arm retainer 110 may attach or connect to the first rail kit 224 of the computing device 230.

In FIG. 2, the computing device 230 and cable management arm 100 may be considered to be in a retracted, fully inserted, or installed position. In such a position, the cable management arm 100 may be closed. In other words, the first cable management arm 102 may be adjacent to and/or parallel (or substantially parallel) to the second cable management arm 104.

In another example, the first cable management arm 102 may include one or more cable loops or cable management arm baskets 210, 212. In an example, the first cable management arm 102 may include rigid cable loops or cable management arm baskets 210 and flexible cable loops 212. In another example, the first cable management arm 102 may include a cable management arm extension 236. In such examples, the cable management arm extension 236 may include a cable loop or cable management arm basket 214. In another example, the second cable management arm 104 may include one or more cable loops or cable management arm baskets 204, 206. In an example, the second cable management arm 104 may include rigid cable loops or cable management arm baskets 204 and flexible cable loops 206. In another example, the second cable management arm 104 may include a cable management arm extension 234. In such examples, the cable management arm extension 236 may include a cable loop or cable management arm basket 208. In another example, the cable management arm retainer 110 may connect to the inner slide 112 via an attachment bracket (not shown). Further, the cable management arm retainer 110 may engage with or attach to the connector 228 of the second rail kit 226 via a rail kit connector 120.

Figure 3:
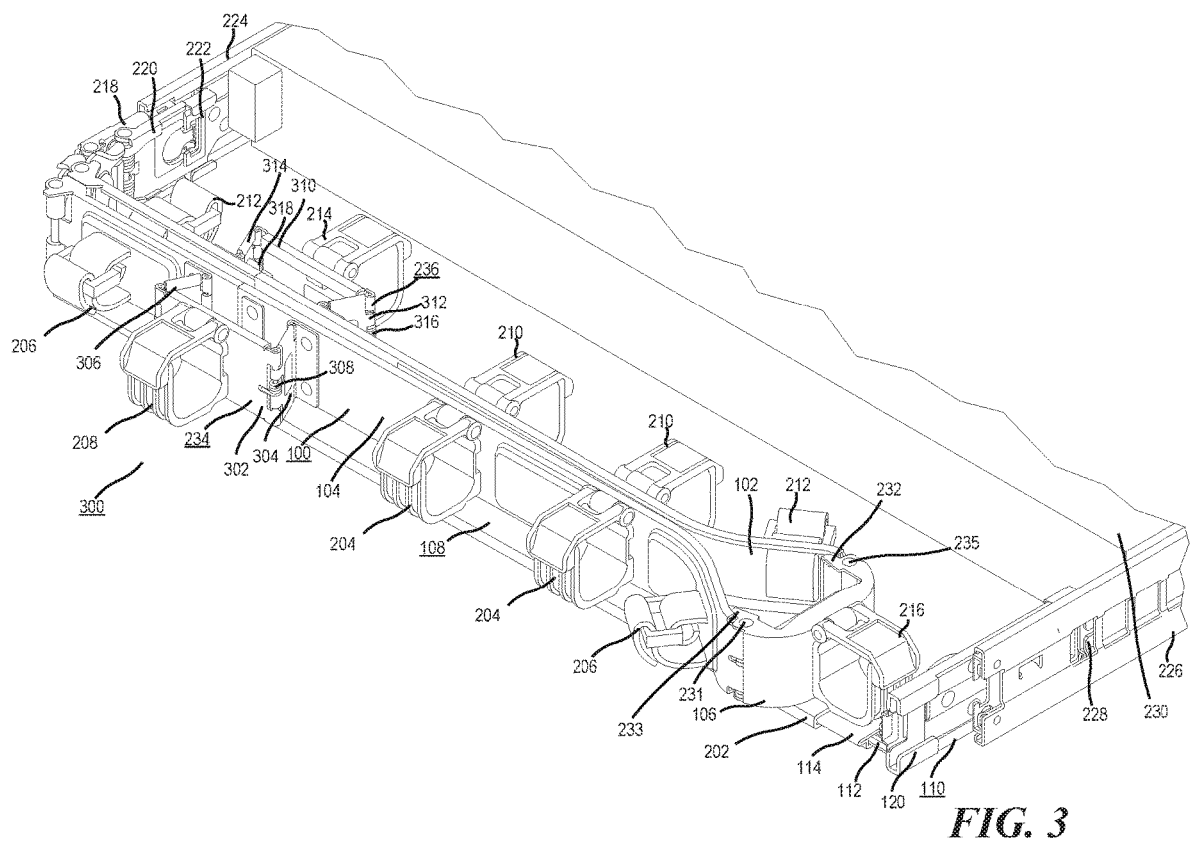
FIG. 3 is a close-up schematic view of a cable management arm attached to a computing device, according to an example.

FIG. 3 is a close-up schematic view of a cable management arm 100 attached to a computing device 230. As noted above, the first cable management arm 102 may include a cable management arm extension 236. In another example, the second cable management arm 104 may include a cable management arm extension 234. The cable management arm extension 234, 236 may include a first hinge 304, 312 fixedly connected, via pin or other fastener, to one of the first or second cable management arms 102, 104. The cable management arm extension 234, 236 may include a second hinge 306, 314 fixedly connected, via pin or other fastener, to one of the first or second cable management arms 102, 104. The first hinge 304, 312 and the second hinge 306, 314 may each hingedly connect to an end of a flat piece or plate 302, 310, thus forming the cable management arm extension 234, 236. In another example, the connection point between the first hinge 304 and plate 302 may include a spring 308 and the connection point between the second hinge 306 and plate 302 may include spring (not visible), the springs to prevent the cable management arm extension 234 from over-extending or extending inwards. In another example, the spring 308 may provide tension to allow for the cable management arm extension 234 to return to shape upon retraction from an extended position. In another example, the connection point between the first hinge 312 and plate 310 may include a spring 316 and the connection point between the second hinge 314 and plate 310 may include spring 318, the springs to prevent the cable management arm extension 236 from over-extending or extending inwards. In another example, the spring 318 may provide tension to allow for the cable management arm extension 236 to return to shape upon retraction from an extended position. In an example, the flat piece or plate 302, 310 may include apertures or mounts to allow for mounting of cable loops or cable management arm baskets (for example, cable loop or cable management arm basket 208, 214).

Figure 4:
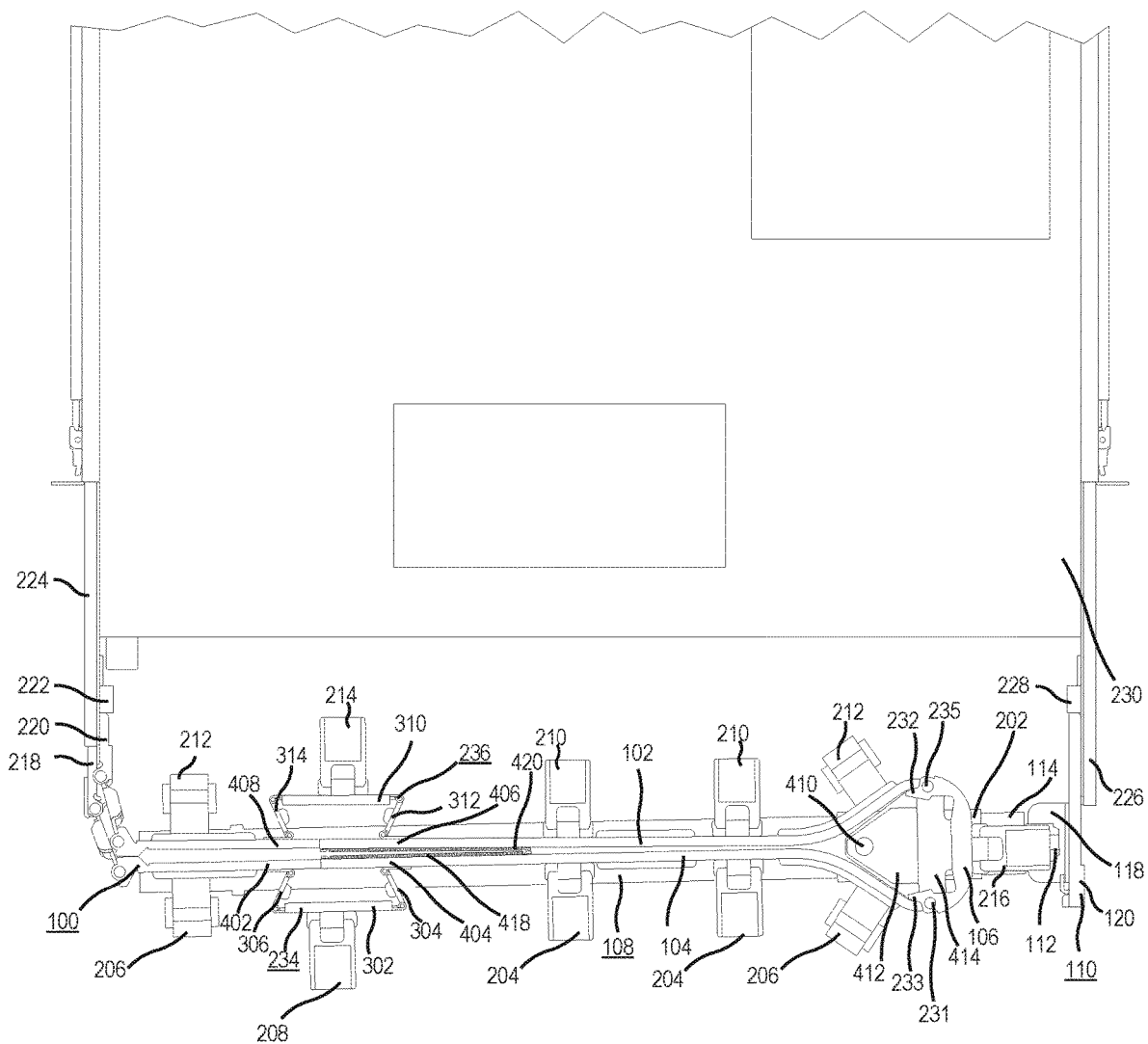
FIG. 4 is a top-down schematic view of a cable management arm attached to a computing device, according to an example.

FIG. 4 is a top-down schematic view of a cable management arm 100 attached to a computing device 230. As noted above the first cable management arm 102 and/or second cable management arm 104 may comprise two separate sections. The first cable management arm 102 may include a first section 406 and a second section 408. The second cable management arm 104 may include a first section 404 and a second section 402. In such examples, the first section 404, 406 may meet, engage, or connect to the second section 402, 408 at around the midpoint of a cable management arm extension 234, 236. In an example, the back side of the first section 404, 406 may include a channel. In an example, the back side of the second section 402, 408 may include a rail. The rail may insert into the channel, when the first section 404, 406 and the second section 402, 408 are adjacent. Upon extension of the cable management arm 100, the rail may extend out of the channel. In another example, a spring 418, 420 may connect the rail to the first section 404, 406. In such examples, upon retraction of the cable management arm 100, the spring 418, 420 may force the rail to snap back into the channel. In other word, the spring 418, 420 may provide an amount of tension to assist the cable management arm extension 234, 236 in returning back to shape.

As noted above, the cable management arm connector 106 may include a flat triangular or wedge shaped lower section 412 and an upper section 414. The wedge shaped lower section 412 and upper section may be formed on or integral to the cable management arm connector 106. The upper section 414 may extend out from the inside of the cable management arm connector 106 and include a wall that connects the upper section 414 to the wedge shaped lower section 412. The wedge shaped lower section 412 of the connector may include an aperture. A short slide 202 of the rail kit 108 may include an aperture corresponding to the aperture of the wedge shaped lower section 412. A pin 410 or fastener may be inserted into the corresponding apertures and secured. In a further example, the pin 410 or fastener may allow the cable management arm connector 106 to pivot about the rail kit 108.

As noted above, the inner slide 112 may pivotally connect to the attachment bracket 118 of the cable management arm retainer 110. In such examples, the cable management arm retainer 110 may include an attachment bracket 118 with an aperture or connection point formed at the bottom edge of the attachment bracket 118 (for example, where the inner slide 112 connects to the attachment bracket 118). In such examples, the inner slide 112 may pivotally connect to the attachment bracket 118 of the cable management arm retainer 110. Further, the inner slide 112 may pivotally connect to the attachment bracket 118 via a pin or fastener, which may allow the inner slide 112 to pivot about the attachment bracket 118 as the computing device 230 is extended and, thus, as the cable management arm 100 extends.

Figure 5:
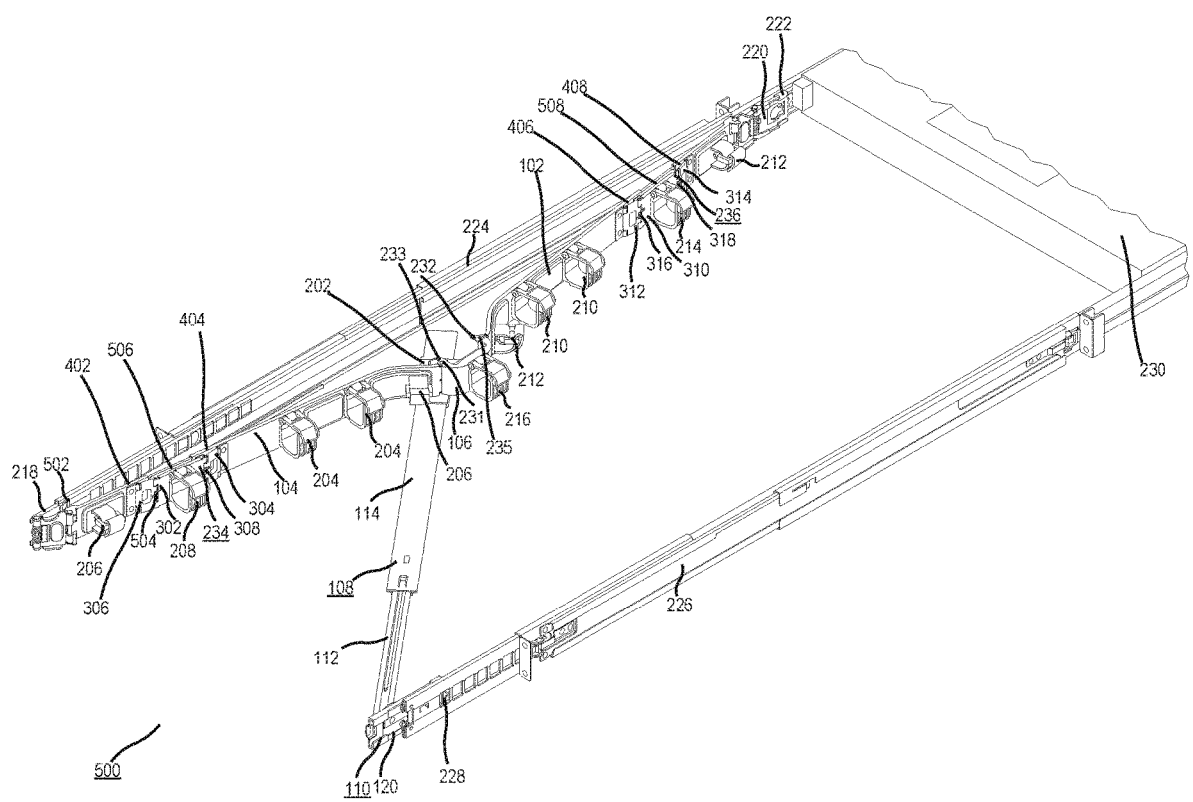
FIG. 5 is a schematic view of a cable management arm, in an extended position, attached to a computing device, according to an example.

FIG. 5 is a schematic view of a cable management arm 100, in an extended position, attached to a computing device 230. In an example, the computing device 230 may be longer and heavier than a normal computing device. In such examples, the computing device 230 may extend further than normal, to allow users to reach or access various components within the computing device 230. In such examples, a standard cable management arm may not extend far enough to allow for access to every component. Additionally, merely lengthening a cable management arm may not be sufficient, as lengthening a cable management arm may prevent the cable management arm from fitting into a rack. In FIG. 5, the cable management arm 100 may be extended further than a standard cable management arm. The cable management arm 100 may extend further and fit into a rack, based on the addition of the rail kit 108 underneath the cable management arm 100, as well as the cable management arm retainer 110, supporting the additional weight and/or the addition of the cable management arm extensions 234, 236.

In another example, the other end of the second cable management arm 104 may include a latch 218 to connect to or engage with a second connector 502 of the first rail kit of the computing device 230. In such examples, the second connector 502 of the first rail kit of the computing device 230 may remain stationary (as in, not move as the computing device 230 is extended/retracted).

As noted above, the back side of the first section 404, 406 may include a channel. In an example, the back side of the second section 402, 408 may include a rail 506, 508. The rail 506, 508 may insert into the channel, when the first section 404, 406 and the second section 402, 408 are adjacent. Upon extension of the cable management arm 100, the rail 506, 508 may extend out of the channel.

Figure 6:
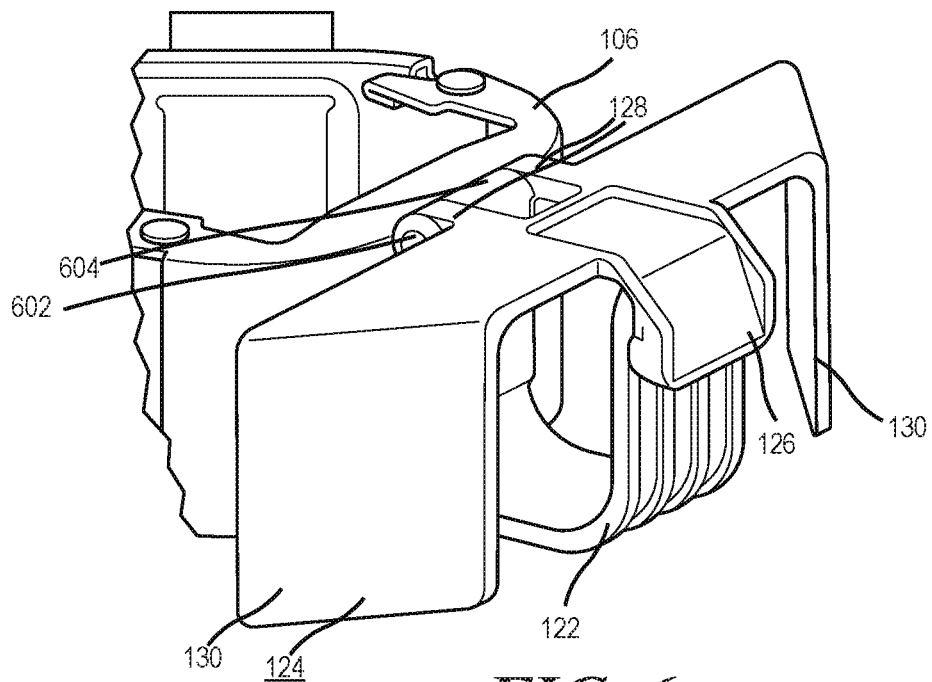
FIG. 6 is a schematic view of a cable management arm basket clip, according to an example.
Figure 7:
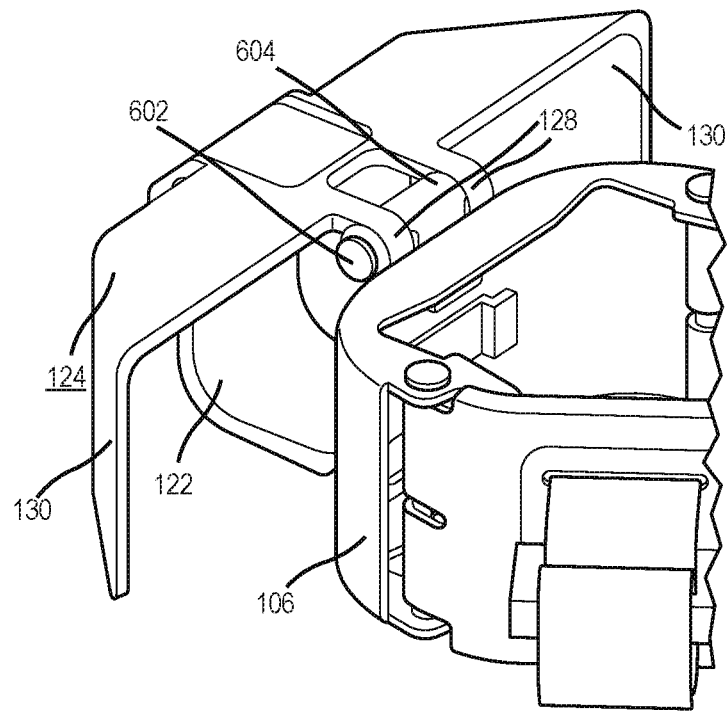
FIG. 7 is another schematic view of a cable management arm basket clip, according to an example.

FIG. 6 and FIG. 7 are schematic views of a cable management arm basket clip 124, according to an example. In such examples, the cable management arm basket clip 124 may include a latch 126, a connection 128, and guards 130. As noted above, the cable management arm basket clip 124 may include a latch 126. The latch 126 may catch or lock onto a notch or protrusion of the cable management arm basket 122. In an example, to unlock or unlatch the cable management arm basket clip 124, a user may exert an upwards force or an out and upwards force. In another example, to lock or latch the cable management arm basket clip 124, a user may press the cable management arm basket clip 124 down. In another example, the cable management arm basket clip 124 may include a lock or locking mechanism. Further, the lock or locking mechanism may be included in addition to the latch 126 to prevent movement of the cable management arm basket clip 124 in the event of an external force.

In another example, the cable management arm basket clip 124 may include a connection 128. In an example, the connection 128 may be a clip, clips, a latch, or some other means of toolless connection between the cable management arm basket 122 and the cable management arm basket clip 124. The clip or clips (or other means of connection mentioned above) may attach to a rod, pin or, integral attachment point on the cable management arm basket 122. Further, the clip or clips may allow for pivoting of the cable management arm basket clip 124 rod, pin or, integral attachment point of the cable management arm basket 122. For example, the clips may connect to attachment point 604. Further, pins 602 may hold the cable management arm basket clip 124 in place, while allowing the cable management arm basket clip 124 to pivot about the attachment point 604.

In another example, the cable management arm basket clip 124 may include a guard or guards 130. As noted above, the guards 130 may be angled out from the cable management arm basket clip 124. In an example, the guards 130 may be disposed on or integrally formed on the cable management arm basket clip 124

In another example, the cable management arm basket 122 may be smaller than the height of a 1U computing device, substantially the same height as a 1U, or larger height than a 1U. In another example, the cable management arm basket clip 124 may be smaller than the height of a 1U computing device, substantially the same height as a 1U, or larger height than a 1U. For example, a cable management arm basket 122 may be close to 1U in height. However, the cable management arm basket clip 124 may vary in size to support a variety of computing device sizes (such as, a 2U (or close to 2U) sized cable management arm basket clip).

Figure 8:
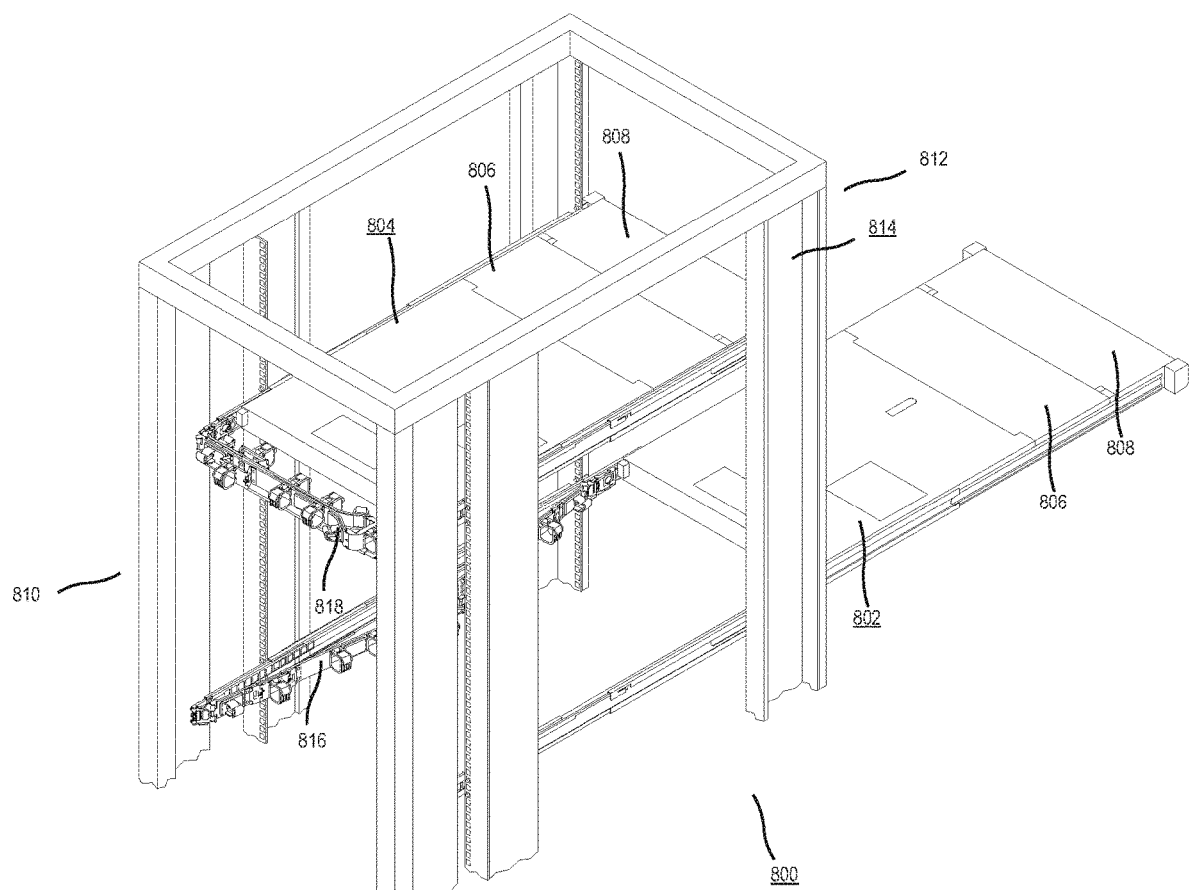
FIG. 8 is a schematic view of two computing devices, one retracted and one extended, in a rack, each with a cable management arm, according to an example.

FIG. 8 is a schematic view of two computing devices 802, 804, one retracted and one extended, in a rack 814, each with a cable management arm 816, 818. In an example, the computing devices 802, 804 may be rack servers. Further, the computing devices 802, 804 may be longer and/or heavier than normal. For example, computing device 802 and computing device 804 each may include two extra device cages 806, 808 (for example, drive cages). In such examples, a user may pull the computing device, from the front 812, out further than normal to access components towards the back 810 of the computing devices 802, 804. In an example, the computing device 802, 804 may include cable management arms 816, 818, as described above. In an example, the computing device 802 is in an extended position. In another example, the computing device 804 is in a retracted or installed position.

Figure 9:
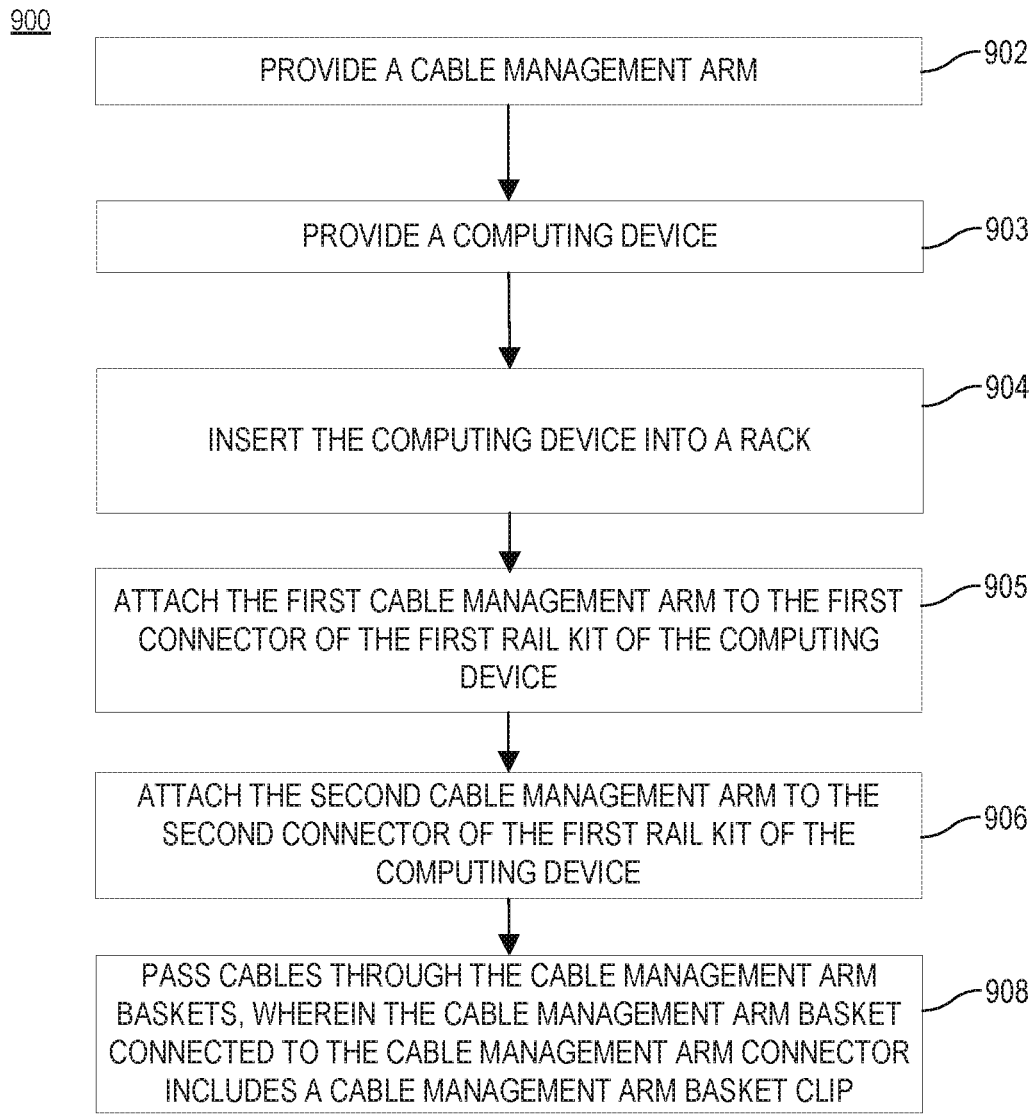
FIG. 9 is a method of attaching the cable management arm to a computing device, according to an example.

FIG. 9 is a method of attaching a cable management arm to a computing device. Although execution of method 900 is described below with reference to the cable management arm 100 of FIG. 1, other suitable cable management arms and computing devices may be utilized. Additionally, implementation of method 900 is not limited to such examples. At block 902, a user may provide a cable management arm 100 for attaching to a computing device. At block 903, a user may provide a computing device (for example, a server) to attach the cable management arm 100 to. Further, at block 904 a user may insert the computing device into a rack.

At block 905 and 906, a user may attach the first cable management arm 102 to the first connector of the first rail kit of the computing device and may attach the second cable management arm 104 to the second connector of the first rail kit of the computing device.

At block 908, a user may attach cables to the computing device. In another example, the user may then pass the cables through the cable loops, cable management arm baskets or cable retainers of the first cable management arm 102. The user may then pass the cables through the cable loop, cable management arm basket, cable loops, cable management arm baskets, or cable retainers of the cable management arm connector 106. The user may then pass the cables through the cable loops or cable retainers of the second cable management arm 104.

In another example, when the cables are removed from or not present in the cable management arm 100, a user may remove or disconnect the second cable management arm 104 from the second connector of the first rail kit. Further, the user may remove or disconnect the first cable management arm 102 from the first connector of the first rail kit. Further still, a user may remove or disconnect the rail kit connector 120 of the cable management arm retainer 110 from the connector of the second rail kit.

After complete removal of the cable management arm 100, a user may attach the cable management arm 100 in a different position (for example, the reverse of the original position). In such examples, the user may unlock the attachment bracket 118 from the rail kit connector 120. To unlock the attachment bracket 118, the user may actuate the latch of the rail kit connector 120. After unlocking the attachment bracket 118 from the rail kit connector 120, the user may pivot (in other words, alter or change the orientation of) the rail kit connector 120 to another position. When the rail kit connector 120 is fully moved to the other position, the latch may lock into the attachment bracket 118.

After changing the orientation of the cable management arm retainer 110, the user may attach the second cable management arm 104 to another connector of the second rail kit. The user may attach the first cable management arm 102 to the connector of the second rail kit. The user may then attach the rail kit connector 120 to the second connector of the first rail kit 224. The user may then pass the cables back through the cable management arm 100.

Although the flow diagram of FIG. 9 shows a specific order of execution, the order of execution may differ from that which is depicted. For example, the order of execution of two or more blocks or arrows may be scrambled relative to the order shown. Also, two or more blocks shown in succession may be executed concurrently or with partial concurrence. All such variations are within the scope of the present disclosure.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Varations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be examples. Structure and acts described herein are replaceable by equivalents, which perform the same function, even if the structure or acts are different, as known in the art. Therefore, the scope of the present disclosure is limited only by the elements and limitations as used in the claims

What is claimed is:

1. A cable management arm that is transitionable between a retracted state and an extended state, comprising:
    a first cable management arm to connect to a first connector of a first rail kit of a computing device and a second cable management arm to connect to a second connector of the first rail kit of the computing device, the first cable management arm including a cable management arm extension, the cable management arm extension including a plate that is transitionable between a first position spaced apart by a first distance from the first cable management arm and a second position spaced apart by a second distance from the first cable management arm, the first distance different from the second distance, the plate being substantially parallel to the first cable management arm in both the first position and the second position;
    a cable management arm connector to pivotally attached to each of the first cable management arm and the second cable management arm; and
    cable management arm baskets connected to the first cable management arm, the second cable management arm, and the cable management arm connector,
    wherein the cable management arm basket connected to the cable management arm connector includes a cable management arm basket clip.

2. The cable management arm of claim 1, wherein the cable management arm basket clip comprises:
    a latch to secure the cable management arm basket clip to the cable management arm basket of the cable management arm connector; and
    a connection to pivotally connect the cable management airn basket clip to the cable management arm basket of the cable management arm connector.

3. The cable management arm of claim 2, wherein the cable management arm basket clip includes a first guard located at one end of the cable management arm basket clip and a second guard located at the other end of the cable management arm basket clip.

4. The cable management arm of claim 3, wherein the first guard is angled towards a first direction away from a first side of the latch and the second guard is angled in a second direction away from a second side of the latch.

5. The cable management arm of claim 4, wherein the first direction is perpendicular to the second direction.

6. The cable management arm of claim 3, wherein the cable management arm basket clip is movable between a first position and a second position.

7. The cable management arm of claim 6, wherein the cable management arm basket clip is lifted up in the first position.

8. The cable management arm of claim 7, wherein the cable management arm basket clip is secured to the cable management arm basket in the second position.

9. The cable management arm of claim 3, wherein the cable management arm basket clip is removably connected to the cable management arm basket.

10. A method, comprising:
    providing the cable management arm of claim 3;
    providing a computing device;
    inserting the computing device into a rack;
    attaching the first cable management arm to the first connector of the first rail kit of the computing device;
    attaching the second cable management arm to the second connector of the first rail kit of the computing device; and
    passing cables through the cable management arm baskets.

11. The method of claim 10, further comprising:
    lifting the cable management arm basket clip up; and
    passing the cables through the cable management arm basket connected to the cable management arm connector.

12. The method of claim 11, wherein the cable management arm basket clip is removably connected to the cable management arm basket.

* * * * *